United States Patent [19]
Zarubinsky et al.

[11] Patent Number: 5,889,482
[45] Date of Patent: Mar. 30, 1999

[54] ANALOG-TO-DIGITAL CONVERTER USING DITHER AND METHOD FOR CONVERTING ANALOG SIGNALS TO DIGITAL SIGNALS

[75] Inventors: Michael Zarubinsky, Jerusalem; Yachin Afek, Kfar Saba; Vladimir Koifman, Le Zion, all of Israel

[73] Assignee: Motorola Inc., Austin, Tex.

[21] Appl. No.: 944,639

[22] Filed: Oct. 6, 1997

[51] Int. Cl.[6] .................................................. H03M 1/20
[52] U.S. Cl. .......................................... 341/131; 341/143
[58] Field of Search .................................... 341/131, 143, 341/155

[56] References Cited

U.S. PATENT DOCUMENTS

| | | | |
|---|---|---|---|
| 4,968,987 | 11/1990 | Naka et al. | 341/143 |
| 5,144,308 | 9/1992 | Norsworthy | 341/131 |
| 5,323,157 | 6/1994 | Ledzius et al. | 341/143 |
| 5,483,238 | 1/1996 | Norsworthy | 341/131 |

FOREIGN PATENT DOCUMENTS

| | | | |
|---|---|---|---|
| 5284033 | 10/1993 | Japan | H03M 3/02 |
| 2235599 | 3/1991 | United Kingdom | H03M 1/20 |

OTHER PUBLICATIONS

Franca, J. E., Tsividis, Y, "Design of Analog–Digital VLSI Circuits for Telecommunications and Signal Processing", Second Edition, Prentice Hall, Englewood cliffs, 1994, chapter 10 Delta–Sigma Data Converters by Temes, G. C., on pp. 317–339;.

Norsworthy, S. R., Schreier, R., Temes, G. C.: "Delta–Sigma Data Converters", IEEE Press, New York, 1997, ISBN 0-7803-1045-4;.

Proakis, J. G., Manolakis, D. G., "Digital Signal Processing", Third Edition, Prentice Hall, Englewood Cliffs, 1996, chapter 9.2. Analog–to–Digital Conversion, on pp. 748–762, and chapter 3.1. Z–Transform, on pp. 151–160.

*Primary Examiner*—Howard L. Williams
*Assistant Examiner*—Peguy JeanPierre
*Attorney, Agent, or Firm*—Robert H. Handy

[57] ABSTRACT

An analog-to-digital converter (100) has a first path (110) with a first sigma-delta modulator (114) which transforms an analog input signal $X_0$ (111') from an input terminal (101) to a digital output signal $Y_0$ at an output terminal (102). In a second path (120), a digital dither signal D (121') is combined with a digital intermediate signal $Z_0$ (115') from the first modulator (114) and digitally processed by a second sigma-delta modulator (124) to an intermediate signal $Y_1$ (125') $Y_1$ is fed to the first modulator (114) and to the output terminal (102) with opposite sign ("+" and "−", respectively). Thereby, multipliers (133 and 127) attenuate $Y_1$. The dither signal D (121') is used substantially only within the converter (100), and is substantially canceled before the output terminal (102). This features preserve a high SNR of the converter (100) and low spectral tones in output signal $Y_0$.

27 Claims, 6 Drawing Sheets

ANALOG-TO-DIGITAL CONVERTER USING DITHER AND METHOD FOR CONVERTING ANALOG SIGNALS TO DIGITAL SIGNALS

CROSS REFERENCE TO RELATED APPLICATIONS

The present application is related to the following U.S. patent applications: "DITHERED SIGMA DELTA MODULATOR HAVING PROGRAMMABLE FULL SCALE RANGE ADJUSTMENT" invented by Kiyoshi Kose, having Attorney Docket No. SC90504A, filed Aug. 4, 1997, having U.S. Pat. Ser. No. 08/905,700, and assigned to the assignee hereof.

FIELD OF THE INVENTION

The present invention generally relates to analog-to-digital converters, and more particularly, to analog-to-digital converters using sigma-delta modulators and to a method.

BACKGROUND OF THE INVENTION

By modern electronics, useful information (for example voice, measurement data, music, control commands, etc.) is transmitted, processed or otherwise manipulated by signals in analog (A) form or digital (D) form. Signal conversion between analog (A) and digital (D) signals in both directions is thereby often required. The quality of analog-to-digital (A/D) converters and digital-to-analog (D/A) converters and other electronic circuits can be expressed by, for example, a signal-to-noise ratio (SNR) indicating how useful signals are separated from unwanted signals.

Sigma-delta modulators serving as analog-to digital converters are well known in the art and had been described in a variety of publications. For the application of sigma-delta modulators and for prior art designs, the following references are useful:

[1] Franca, J. E., Tsividis, Y. (editors): "Design of Analog-Digital VLSI Circuits for Telecommunications and Signal Processing", Second Edition, Prentice Hall, Englewood Cliffs, 1994, ISBN 0-13-203639-8, chapter 10 "Delta-Sigma Data Converters" by Temes, G. C., on pages 317–339;

[2] Norsworthy, S. R., Schreier, R., Temes, G. C.: "Delta-Sigma Data Converters", IEEE Press, New York, 1997, ISBN 0-7803-1045-4; and

[3] Proakis, J. G., Manolakis, D. G.: "Digital Signal Processing", Third Edition, Prentice Hall, Englewood Cliffs, 1996, ISBN 0-13-373-762-4, chapter 9.2. "Analog-to-Digital Conversion", on pages 748–762, and chapter 3.1. "Z-Transform", on pages 151–160.

FIG. 1 illustrates a simplified block diagram of sigma-delta modulator 20 (hereinafter modulator 20) as known in the prior art. Modulator 20 comprises adder 22 ("+"), integrator 24 ("INT"), comparator 26 ("CP"), and digital-to-analog (D/A) converter 28. Optionally, modulator 20 also comprises dither generator 30 (U-shaped dashed frame) having, for example, digital dither generator 32 ("DITHER", producing signal d'), digital-to-analog (D/A) converter 34 (producing signal d), adder 36 ("+") and subtractor 38 ("−").

Elements within dashed frame 20' are considered first with signal d assumed to be initially set to zero, i.e. signal d=0. Adder 22 receives analog input signal x and feedback signal -z and provides (x-z) to integrator 24. Integrator 24 integrates (x-z) and provides ∫(x-z) to comparator 26. Comparator 26 compares ∫(x-z) to a reference signal r and provides output signal y as a series of binary values such as, e.g., "+1" and "−1". The sequence of the "+1"and the "−1" values in y represents the analog input signal x. D/A converter 28 uses output signal y to provide the feedback signal -z to adder 22.

The digital output signal y of modulator 20' (within frame 20') can show unwanted signals, such as for example, periodical fluctuations. This happens, for example, when analog input signal x is constant over a certain time period, or when the input signal x is small in comparison to its signal range. Adding dither signals d, for example, to input signal x is used in the art to improve the performance of the modulator. In dither generator 30, digital dither generator 32 provides a digital random signal d' and D/A converter 34 transforms d' to an analog dither signal d. Adder 36 adds dither signal d to analog input signal x and subtractor 38 subtracts d' from digital output signal y.

However, such conventional dithering suffers the following main disadvantages: (a) Dither signal d goes through modulator 20 and increases the overall noise within output signal y: (b) Dithering further limits the dynamic range of x (e.g., ratio between $|x_{max}|$ and $|x_{min}|$) because elements which receive x (e.g., adder 22), must not only accommodate, e.g., $|x_{max}|$, but also must accommodate, e.g., $|x_{max}|+|d_{max}|$.

FIG. 2 illustrates a simplified amplitude-frequency diagram 10 of output signal y of sigma-delta modulator 20. Diagram 10 gives an amplitude $|y|$ (| | for absolute values) of signal y on the vertical axis versus increasing frequency f on a horizontal axis. Such a presentation is well known by the term "spectrum". A person of skill in the art is able to measure such spectra without the need for further explanation. Trace 11 shows the spectrum of signal y' of modulator 20 having no dither generator 30 (dashed frame 20' in FIG. 1). Signal y' also has spectral lines 13 for certain frequencies $f_1$, $f_2$, etc., also called "spectral tones". The tones are not wanted. For example, they can be amplified by circuits coupled to the output of modulator 20 or they can cause incorrect operation in these circuits. Trace 12 shows the spectrum of signal y of modulator 20 employing dither generator 30. Dither signal d is preferably, "noise-shaped" with, for example, amplitudes $|d|$ related to the frequency f proportionally or by a square function:

$$|d|\sim f \qquad (1)$$

$$|d|\sim f^2 \qquad (2)$$

Spectral tones in y' are substantially reduced in signal y. However, dithering introduces noise and the amplitude of y is higher than the amplitude of y'. In other words, the SNR of modulator 20 (with dither) is lower than of modulator 20' (without dither).

There is an ongoing need to provide an improved analog-to-digital converter which mitigates these and other disadvantages and limitations of the prior art.

DETAILED DESCRIPTION OF A PREFERRED EMBODIMENT

The analog-to-digital converter of the present invention has a first path with a first sigma-delta modulator which transforms an analog input signal $X_0$ from an input terminal to a digital output signal $Y_0$ at an output terminal. In a second path, a digital dither signal D is combined with a digital intermediate signal $Z_0$ from the first modulator and digitally processed by a second sigma-delta modulator to an intermediate signal $Y_1$. $Y_1$ is fed to the first modulator and to the output terminal with opposite sign and, preferably, $Y_1$ is fed with attenuation. Dither signal D is used substantially only within the converter, and is substantially canceled before the output terminal.

This features preserve a high SNR of the converter similar to converters which do not employ dither. Spectral tones are reduced. The dynamic range of the input signal $X_0$ is increased because only a fraction of the dither signal appears at the input stages. The advantages of dithering, such as increased stability, remain unaffected.

Figure 3:
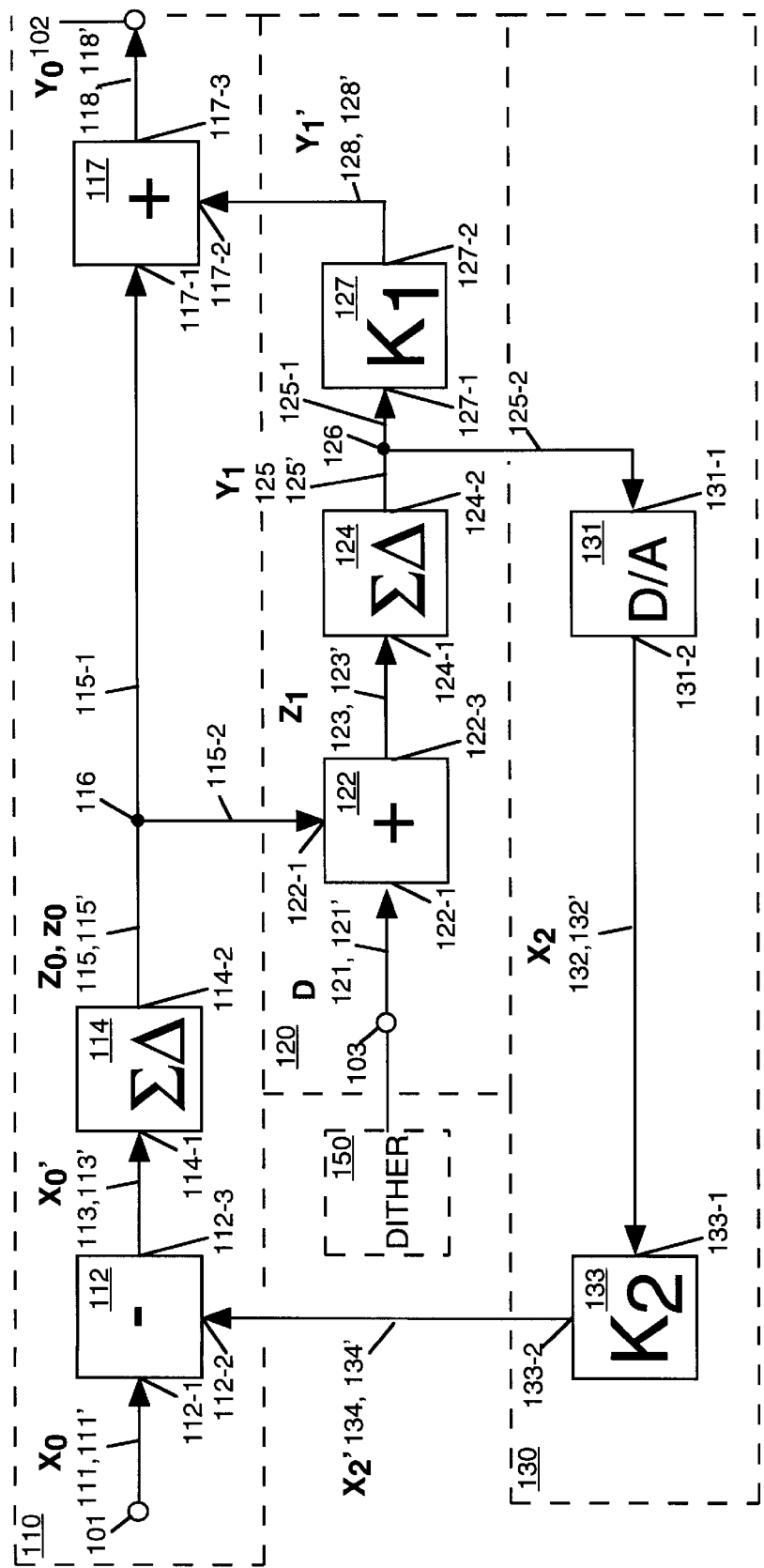
FIG. 3 illustrates a simplified block diagram of an analog-to-digital converter of the present invention.

FIG. 3 illustrates a simplified block diagram of analog-to-digital converter 100 (hereinafter converter 100) of the present invention. Converter 100 comprises sigma-delta modulators 114 and 124 ("ΣΔ", hereinafter modulators), converter 131 ("D/A"), subtractor 112 ("−"), adders 117 and 122 ("+"), and multipliers 127 ("$K_1$") and 133 ("$K_2$"). Elements 112, 114, 117, 122, 124, 127, 131, and 133 of converter 100 are coupled by lines 111, 113, 115, 118, 121, 123, 125, 128, 132, and 134. Arrows → on the lines indicate a preferred signal flow direction. For convenience of explanation, node 116 splits line 115 into lines 115-1 and 115-2; and node 126 splits line 125 into lines 125-1 and 125-2.

Converter 100 receives input signal 111' at input terminal 101 and provides output signal 118' at output terminal 102. Conveniently, converter 100 also receives dither signal 121' from terminal 103. Dither signal 121' can also be provided by an optional internal dither generator 150. Dither generator 150 ("DITHER") is illustrated by a dashed block coupled to terminal 103. Dither generators are well known in the art.

Conveniently, input terminal 101, line 111, subtractor 112, line 113, modulator 114, lines 115 and 115-1, node 116, adder 117, and output terminal 102 form path 110; line 115-2, terminal 103, line 121, adder 122, line 123, modulator 124, lines 125 and 125-1, multiplier 127, and line 128 form path 120; and line 125-2, converter 131, line 132, multiplier 133, and line 134 form path 130. For convenience of explanation, paths 110, 120, and 130 are indicated by dashed enclosures.

In path 110, input terminal 101 is coupled to input 112-1 of adder 112 via line 111. Adder 112 has also input 112-2 coupled to path 130 by line 134. Output 112-3 of adder 112 is coupled to input 114-1 of modulator 114 via line 113. Output 114-2 of modulator 114 is coupled to input 117-1 of adder 117 via line 115, node 116 and line 115-1. Adder 117 has input 117-2 coupled to path 120. Output 117-3 of adder 117 is coupled to output terminal 102 via line 118.

In path 120, line 115-2 from node 116 (from modulator 114 in path 110) is coupled to input 122-1 of adder 122. Terminal 103 is coupled to input 122-1 of adder 122 via line 121. Output 122-3 of adder 122 is coupled to input 124-1 of modulator 124. Output 124-2 of modulator 124 is coupled to input 127-1 of multiplier 127 via line 125, node 126 and line 125-1. Output 127-2 of multiplier 127 is coupled to input 117-2 of adder 117 (path 110).

In path 130, line 125-2 from node 126 (output 124-2 of modulator 124 in path 120) is coupled to input 131-1 of converter 131. Output 131-2 of converter 131 is coupled to input 133-1 of multiplier 133 via line 132. Output 133-2 of multiplier 133 is coupled to input 112-2 of subtractor 112 (path 110).

In FIG. 3, signals have primed reference numbers corresponding to unprimed reference numbers of the lines. In the following, signals are identified by letters having optional subscript indices (e.g., 0, 1, and 2 ) and prime markers ('). In path 110, signals are: an input signal $X_0$ (111') from terminal 101 on line 111; an intermediate signal $X_0'$ (113') on line 113; an intermediate signal $Z_0$ (115') on lines 115 and 115-1; and an output signal $Y_0$ (118') on line 118 and terminal 102. Path 120 has the signal $Z_0$ on line 115-2; the dither signal D (121') at terminal 103 and line 121, an intermediate signal $Z_1$ (123') on line 123; the intermediate signal $Y_1$ (125') on line 125 and 125-1; and the intermediate signal $Y_1'$ (128') on line 128. Path 130 has the signal $Y_1$ on line 125-2; an intermediate signal $X_2$ (132') on line 132; and an intermediate signal $X_2'$ (134') on line 134.

Path 110 receives input signal $X_0$ from terminal 101, signal $Y_1'$ from path 120 on line 128 and signal $X_2'$ from path 130 on line 134 and provides output signal $Y_0$ to terminal 102 on line 110. Path 120 on line 125-2 receives signal $Z_0$ from path 110 and provides signal $Y_1'$ to path 110. Path 130 receives signal $Y_1$ from path 120 and provides signal $X_2'$ to path 110.

A person of skill in the art is able, based on the description herein, to implement the present invention by, for example, active and passive electronic components (transistors, resistors, connections or the like). Such persons are also able to provide power supplies, reference signals r (for e.g., modulators 114 and 124), clock signals and others which are not shown for simplicity.

Details are explained in the following. The terms "input", "output", "intermediate" and "component" modifying the term "signal" are omitted for simplicity.

In path 110, subtractor 112 receives input signal $X_0$ and signal X2' and provides signal $X_0'$:

$$X_0' = X_0 - X_2' \qquad (3)$$

Modulator receives signal $X_0'$ and provides signal $Z_0$ in a different form, but with substantially unchanged information, i.e. $Z_0 = f(X_0)$. To simplify notation, this is expressed as:

$$Z_0 = X_0' \qquad (4)$$

The same convention is followed with respect to other functionally dependent signal pairs, e.g., $Z_1/Y_1$, $X_2/Y_1$, etc. that are subsequently noted. $Z_0$ comprises a noise component $z_0$ explained later. Adder 117 receives signal $Z_0$ and signal $Y_1'$ and provides output signal $Y_0$:

$$Y_0 = Z_0 + Y_1' \qquad (5)$$

In path 120, adder 122 receives signal $Z_0$ and dither signal D and provides signal $Z_1$:

$$Z_1 = Z_0 + D \qquad (6)$$

Modulator 124 receives signal $Z_1$ and provides signal $Y_1$ in a different form, but with substantially unchanged information:

$$Y_1 = Z_1 \qquad (7)$$

Multiplier 127 receives signal $Y_1$ and multiplies signal $Y_1$ with a multiplication factor $K_1$ to obtain signal $Y_1'$:

$$Y_1'=Y_1*K_1 \quad (8)$$

with symbol * for multiplication. In path 130, converter 131 receives signal $Y_1$ and provides signal $X_2$ in a different form, but with substantially unchanged information:

$$X_2=Y_1 \quad (9)$$

Multiplier 133 receives signal $X_2$ and multiplies signal $X_2$ with multiplication factor $K_2$ to obtain signal $X_2'$:

$$X_2'=X_2*K_2 \quad (10)$$

Preferably, multiplication factors $K_1$ and $K_2$ in multipliers 127 and 133, respectively, have substantially equal magnitude:

$$K_1 \approx K_2 K \quad (11)$$

Collectively, factors $K_1$ and $K_2$ are referred to as multiplication factor K. K can be any real number, positive and negative. Suitable values for K are, for example $0.1 \leq K < 1$, a preferred value is $K \leq 0.25$.

Signal $Z_0$ is further classified into a useful signal component $Z_0'$ and a noise component $z_0$ (lowercase letter) which are assumed to be linearly superimposed:

$$Z_0=Z_0'+z_0 \quad (12)$$

Lowercase letter $z_0$ stands for a noise component of signal originating in modulator 114.

For further explanation, input signal $X_0$ is assumed to be zero:

$$X_0=0 \quad (13)$$

The operation of converter 100 is analyzed beginning with (i) path 110 alone, (ii) paths 110 and 120 combined, and ending (iii) with all paths 110, 120, and 130 combined together.

(i)

Path 110 is considered only, and signals $X_2'$ on line 134 and $Y_1'$ on line 127 coming from paths 130 and 120, respectively should be zero:

$$X_2'=0 \text{ and } Y_1'=0 \quad (14)$$

Subtractor 112 would pass signal $X_0$ to signal $X_0'$ unchanged:

$$X_0=X_0' \quad (15)$$

Signal $Y_0$ would be formed substantially only by noise $z_0$ originating from sigma-delta converter 114:

$$Y_0=z_0 \quad (16)$$

(ii)

Paths 110 and 120 are considered together. Signal $X_2'$ on line 134 is assumed to be zero for purposes of explanation:

$$X_2'=0 \quad (17)$$

In path 120, adder 122 provides $$Z_1=z_0+D \quad (18)$$

and sigma-delta modulator 124 converts $Z_1$ to $Y_1$ without substantially changing the information of $Z_1$:

$$Y_1=Z_1=z_0+D \quad (19)$$

Multiplier 126 multiplies $Y_1$ with $K_1$ to $Y_1'$:

$$Y_1'=K_1*Y_1=K_1*(z_0+D) \quad (20)$$

In path 110, adder 117 adds $Y_1'$ to $z_0$:

$$Y_0=z_0+Y_1'=z_0+K_1*(z_0+D)=z_0*(1+K_1)+K_1*D \quad (21)$$

(iii)

All paths 110, 120, and 130 are considered together: Converter 131 converts $Y_1$ on line 125-2 to $X_2$ on line 132 without substantially changing its information:

$$X_2=Y_1=z_0+D \quad (22)$$

Multiplier 133 multiplies $X_2$ with $K_2$ to $X_2'$:

$$X_2'=K_2*X_2=K*(z_0+D) \quad (23)$$

In path 110, subtractor 112 provides $X_0'$ as $$X_0'=X_0-X_2'=-X_2'=-K_2*(z_0+D) \quad (24)$$

Sigma-delta converter 114, provides $$Z_0=X_0'+z_0 \quad (25)$$

and adder 117 provides $$Y_0=Z_0+Y_1' \quad (26)$$

$$Y_0=-K*(z_0+D)+z_0+K*(z_0+D)=z_0 \quad (27)$$

which is zero for $K_1=K_2$. Therefore, dither signal D has been compensated and only the noise $z_0$ remains.

Figure 4A:
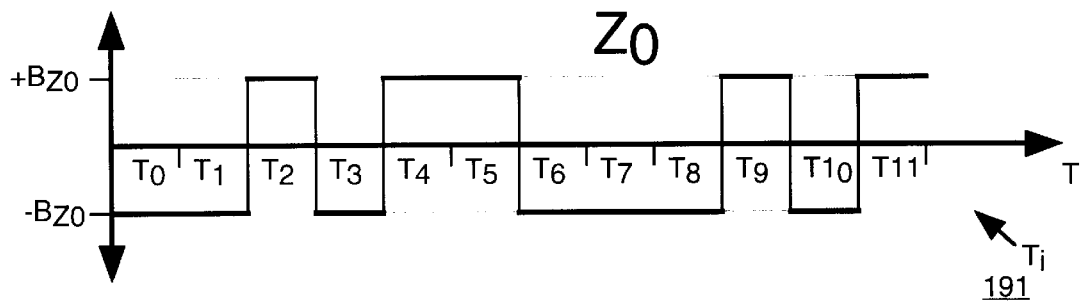
FIG. 4 illustrates simplified time-diagrams of signals occurring in the converter of FIG. 3.
Figure 4B:
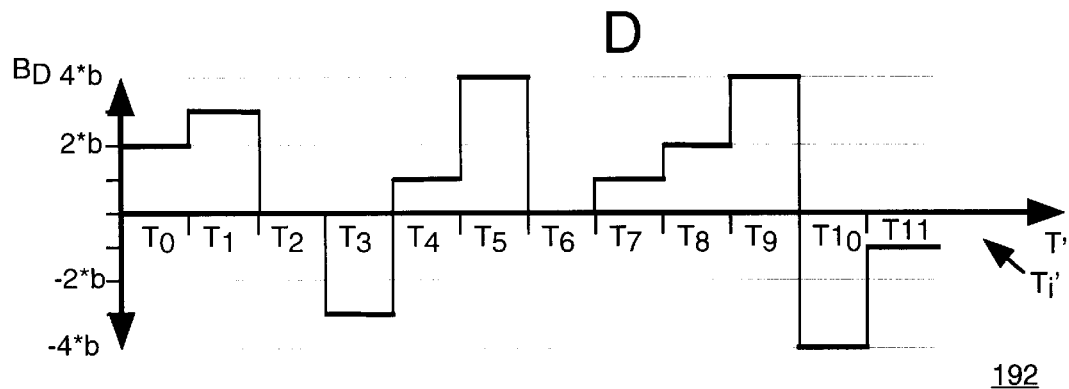
Figure 4C:
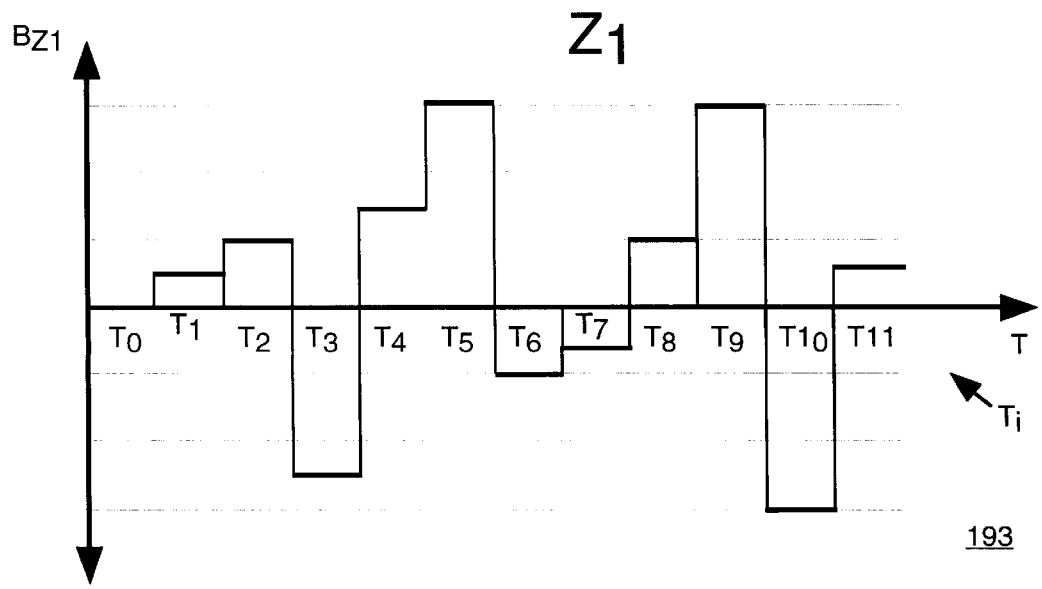

FIG. 4 illustrates simplified time-diagrams of signals occurring in converter 100 of FIG. 3. Diagram 191 illustrates intermediate signals $Z_0$ (115'), diagram 192 illustrates dither signal D (121') and diagram 193 illustrates intermediate signal $Z_1$ (123'). Diagrams 191, 192, and 193 are intended to give an example for purposes of explanation and are not intended to be limiting. Diagrams 191 and 193 have horizontal axes for a discrete time T with intervals $T_0$, $T_1$, $T_2$, etc. (collectively $T_i$). Diagram 192 has a horizontal axis with a discrete time T' with intervals $T_i'$.

Intervals $T_i$ (for $Z_0$ and $Z_1$) have, preferably, equal length which is the reciprocal representation of a sampling rate $F_x$ of modulator 114:

$$T_i=1/F_x \quad (28)$$

with the slash/for division. Similarly, intervals $T_i'$(for D) express a change rate $F_D$ of dither signal D:

$$T_i'=1/F_D \quad (29)$$

For simplicity of explanation, in diagrams 191, 192, and 193, time intervals $T_i$ and $T_i'$ are equal, that is:

$$T_i=T_i' \text{ and } F_D=F_x \quad (30)$$

but this is not essential.

Vertical axes illustrate magnitudes of signals $Z_0$, D, and $Z_1$. The term "magnitude" is used for quantitatively comparing signals $Z_0$, D, and $Z_1$ during a single time interval $T_i$ and between two or more intervals e.g., $T_i$ and $T_{i+1}$. The term "range" is used for the arithmetical difference between maximum and minimum magnitudes for a signal. Magnitudes can be for example, voltages, currents, or other physical units depending on the implementation of converter 100.

As shown in diagram 191, signal $Z_0$ provided by modulator 114 has, preferably, binary values "1" and "−1". One binary value remains constant during one interval $T_i$. Binary value "1" is, preferably, represented by a magnitude $+B_{Z0}$ (maximum), and binary value "−1" is represented by a magnitude $-B_{Z0}$ (minimum). The range R of $Z_0$ is in that case:

$$R(Z_0) = +B_{Z0} - (-B_{Z0}) = 2*|B_{Z0}| \tag{31}$$

with || for absolute values. In the example of diagram 191, $Z_0$ has binary value "−1"(magnitudes $-B_{Z0}$) during intervals $T_0$, $T_1$, $T_3$, $T_6$, $T_7$, $T_8$, and $T_{10}$; and has binary value "+1" ($+B_{Z0}$) during intervals $T_2$, $T_4$, $T_5$, $T_9$, and $T_{11}$.

As shown in diagram 192, dither signal D can be a multilevel signal with different magnitudes $B_D$ between a maximum magnitude $B_{D\ max}$ and a minimum magnitude of $B_{D\ min}$:

$$B_{D\ min} < B_D < B_{D\ max} \tag{32}$$

Preferably, maximum magnitude $B_{D\ max}$ and minimum magnitude $B_{D\ min}$ have opposite sign but equal absolute values, so that:

$$|B_{D\ min}| = |B_{D\ max}| \tag{33}$$

and a range R of dither signals D being, for example:

$$R(D) = 2*|B_{D\ max}| \tag{34}$$

Within the range R(D), dither signal D can assume discrete magnitudes. For example, $B_{D\ max}$ and $B_{D\ min}$ are each divided into N steps or levels b:

$$b = |B_{D\ max}|/N \text{ or } b = |B_{D\ min}|/N \tag{35}$$

so that the magnitude $B_D$ of dither signal D can be expressed, for example, as:

$$B_D = \pm n*b \tag{36}$$

with n being a step index. In the example of diagram 192, N is assumed to be N=4 so that dither signal can have values $-4*b$, $-3*b$, $-2*b$, $-b$, 0, $+b$, $+2*b$, $+3*b$, and $+4*b$.

Preferably, $B_D$ remains constant during one interval $T_i$ and step index n varies randomly. A person of skill in the art is able to provide such a dither signal D, without the need for further explanations.

The ranges $R(Z_0)$ of signal $Z_0$ and R(D) of dither signal D are compared. Preferably, signal D has a larger range than signal $Z_0$:

$$R(D) = Q*R(Z_0) \tag{37}$$

with Q being a range factor. Possible values for Q are Q≈1 ... 8, useful values for Q are Q≈2 ... 6, and preferred values are approximately Q≈4.

The superposition of dither signal D on signal $Z_0$ to obtain signal $Z_1$ is illustrated in diagram 192. Signal $Z_1$ can have maximum and minimum magnitudes and ranges as for example:

$$M_{Z1\ max} = -M_{Z0} + B_{D\ max} \tag{38}$$

$$M_{Z1\ min} = -M_{Z0} - |B_{D\ min}| \tag{39}$$

$$R(Z_1) = R(Z_0) + R(D) \tag{40}$$

Figure 5:
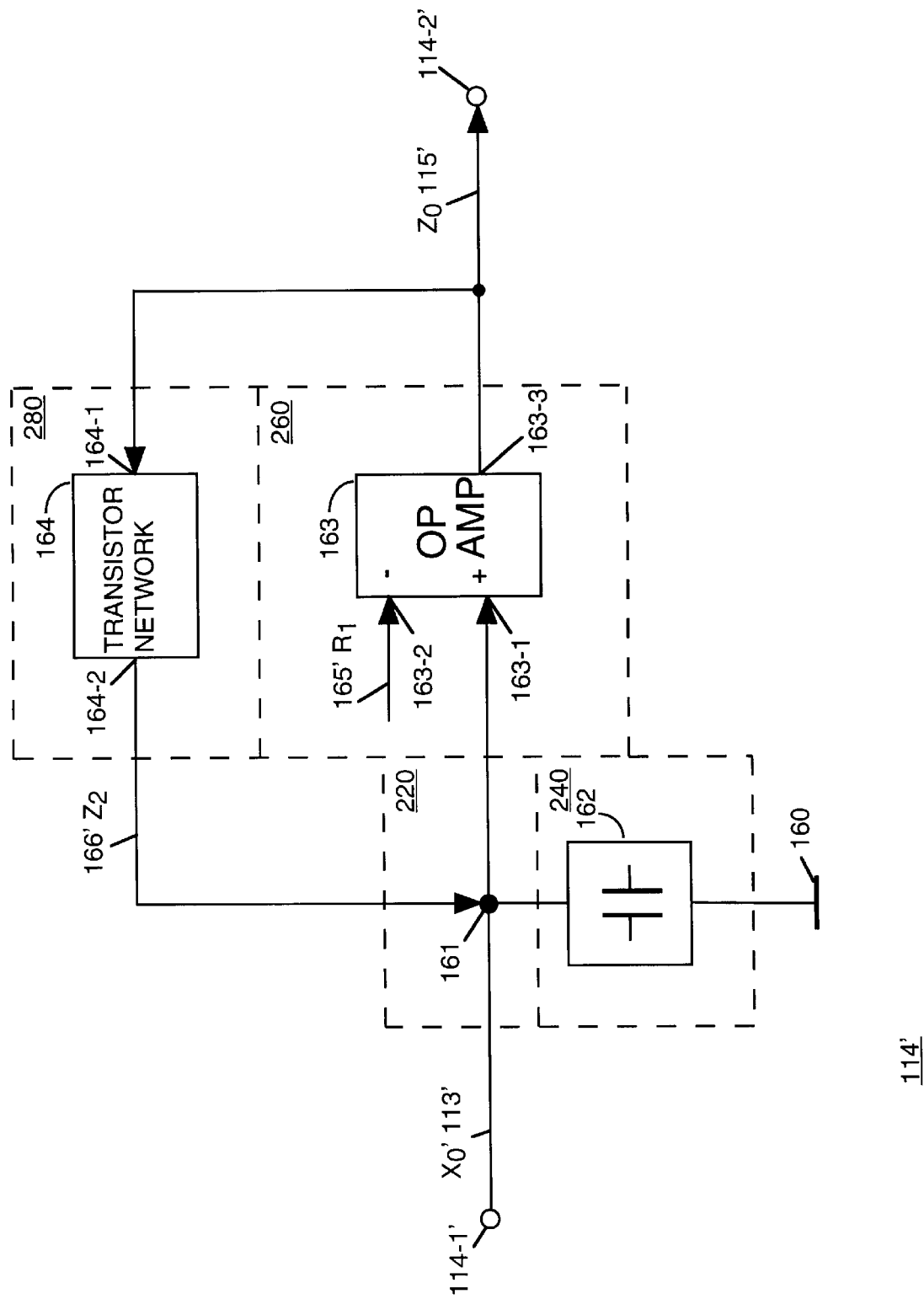
FIG. 5 illustrates a simplified block diagram of a first modulator which can be used in the converter of FIG. 3.
Figure 6:
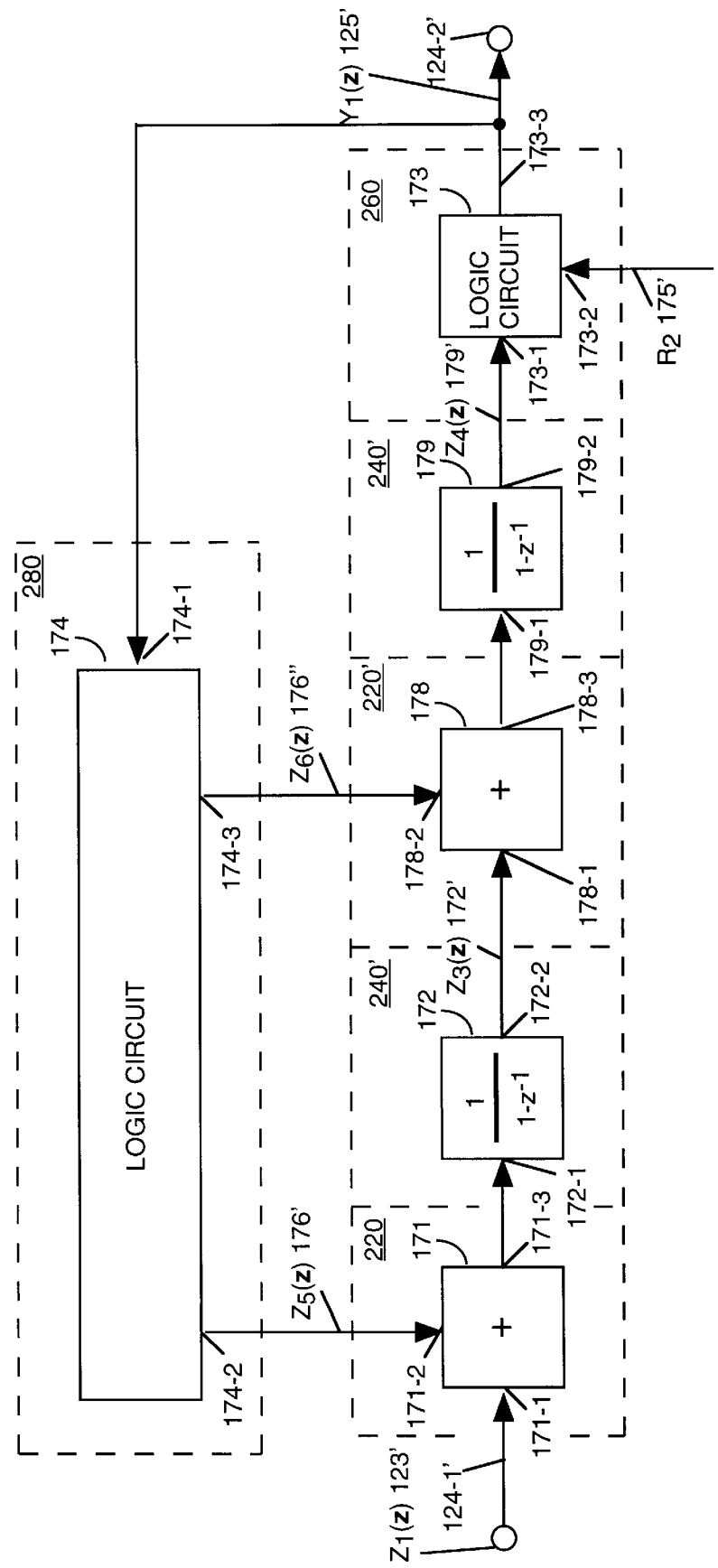
FIG. 6 illustrates a simplified block diagram of a second modulator which can be used in the converter of FIG. 3.

FIGS. 5–6 illustrate by way of non-limiting example, sigma-delta modulators 114' and 124' which can be used as modulators 114 and 124, respectively, in converter 100 of FIG. 3. A person of skill in the art is able to modify modulators 114' and 124', based on the description herein without departing from the scope of the present invention. As shown in FIGS. 5–6 by dashed blocks, sigma-delta modulators 114' and 124' comprise adder 220, integrator 240, comparator 260, and feedback converter 280. Integrator 240 receives an input signal (e.g., $X_0'$ or $Z_1$) via adder 220 and integrates the input signal. Comparator 260 compares the integral of the input signal with a reference signal (e.g., $R_1$ or $R_2$) and provides an output signal (e.g., $Z_0$ or $Y_1$). Feedback converter 280 analyzes the output signal and provides feedback to integrator 240 via adder 220. Construction and function of sigma-delta modulators are well known in the art. In FIGS. 5–6, blocks drawn by plain lines within the dashed blocks represent component which are preferably used as adder 220, integrator 240, comparator 260, and feedback converter 280.

FIG. 5 illustrates a simplified block diagram of modulator 114' which can be used in converter 100. In FIG. 5, reference numbers 114-1', 114-2', 113', and 115' (input, output, $X_0'$, $Z_0$) correspond to reference numbers 114-1, 114-2, 113', and 115' in FIG. 3. Modulator 114' comprises node 161 as adder 220, capacitor 162 as integrator 240, operational amplifier 163 ("op amp") as comparator 260, and transistor network 164 as feedback converter 280. Modulator 114' can therefore be considered as an "analog converter". Input 114-1' is coupled to node 161. Capacitor 162 is coupled between node 161 and reference terminal 160. Node 161 is also coupled to input 163-1 of op amp 163. Output 163-3 of op amp 163 forms output 114-2' of modulator 114' and is also coupled to input 164-1 of transistor network 164. Output 164-2 of transistor network 164 is coupled to node 161. Preferably, input 163-1 of op amp 163 is a non-inverting input ("+") and input 163-2 is an inverting input ("−").

Capacitor 161 integrates signal $X_0'$ (113'). Op amp 163 receives reference signal $R_1$ (165') at input 163-2, compares the integral of $X_0'$ (at input 163-1) to $R_1$ and provides $Z_0$ (115'). Transistor network 164 receives $Z_0$ (at input 164-1 and provides feedback signal $Z_2$ (166') to capacitor 162 via node 161.

FIG. 6 illustrates a simplified block diagram of modulator 124' which can be used in converter 100. Modulator 124' is preferably, a second order modulator with integrators 240 and 240' and adders 220 and 220', but this is not essential for the present invention. The order of modulators is well known in the art. In FIG. 6, reference numbers 124-1', 124-2', 123', and 125' (input, output, $Z_1$, $Y_1$) correspond to reference numbers 124-1, 124-2, 123' and 125' in FIG. 3. Modulator 124' comprises adder unit 171 as adder 220 and adder unit 178 as adder 220', digital summation unit 172 ("counter 172") as integrator 240 and counter 179 as integrator 240', logic unit 173 as comparator 260, and logic unit 174 as feedback converter 280. Modulator 124' can therefore be considered as a "digital converter".

Input 124-1 is coupled to input 171-1 of adder unit 171. Output 171-3 of adder unit 171 is coupled to input 172-1 of counter 172. Output 172-2 of counter 172 is coupled to input 178-1 of adder unit 178. Output 178-3 of adder unit 178 is coupled to input 179-1 of counter 179. Output 179-2 of counter 179 is coupled to input 173-1 of logic unit 173. Output 173-3 of logic unit 173 forms output 124-2' and is coupled to input 174-1 of logic unit 174. Outputs 174-2 and 174-3 of logic unit 174 are coupled to input 171-2 of adder unit 171 and to input 178-2 of adder unit 178, respectively.

In modulator 124', signals conveniently alternate at a rate which is expressed by z-operator of the Z-transformation known in the art from, for example, chapter 3.1 "Z-transform" of [3]. Counter 172 adds up $Z_1(z)$ (123') to provide $Z_3(z)$ (172'), preferably, according to the transfer function:

$$Z_3(z)=Z_1(z)/(1-z^{-1}) \tag{41}$$

Similarly, counter 179 adds up $Z_3(z)$ to provide $Z_4(z)$ (179'). Logic unit 173 receives digital reference signal $R_2$ (175') at input 173-2 and compares $R_2$ with $Z_4(z)$. Depending on the differences of the magnitudes of $R_2$ and $Z_4(z)$, logic unit 173 provides $Y_1(z)$. Logic unit 174 receiving $Y_1(z)$ determines a magnitude and a sign of a correction signals $Z_5(z)$ (176') and $Z_6(z)$ (176"). Adder unit 171 combines $Z_5(z)$ with $Z_1(z)$ and adder unit 178 combines $Z_6(z)$ with $Z_3(z)$. Adder units 171 and 178, counters 172 and 179, and logic units 173 and 174 are well known in the art and can be implemented by a person of skill in the art without the need for further explanations.

In other words, analog-to-digital converter 100 of the present invention has:

path 110 with modulator 114 for transforming an analog input signal $X_0$ from input terminal 101 to a digital output signal $Y_0$ at output terminal 102 via a combiner (e.g., adder 117);

path 120 with (a) a combining unit (e.g., adder 122) for combining a digital dither signal D with a digital intermediate signal $Z_0$ from modulator 114 to produce a digital intermediate signal $Z_1$ and (b) modulator 124 for digitally processing $Z_1$ to produce an intermediate signal $Y_1$ and feeding a first signal (e.g., $Y_1$') depending on $Y_1$ to the combiner (e.g., adder 117) with a first sign (e.g., "+"); and path 130 with a transforming unit (e.g., converter 131) coupled to modulator 124 for feeding a second signal (e.g., $X_2$') depending on $Y_1$ via modulator 114 to the combiner (e.g., adder 117) with substantially equal amplitudes (e.g., $K_1 \approx K_2$) and opposite sign (e.g., "−") to the first signal. Converter 100 has further a first attenuator (e.g., multiplier 127) coupled between modulator 124 and the combiner has and a second attenuator (e.g., multiplier 133) coupled between the transforming unit and modulator 114.

Converter 100 uses dither signal D and converts first signal $X_0$ in a first form (e.g., analog) at input terminal 101 to second signal $Y_0$ in a second form (e.g., digital) at output terminal 102. Converter 100 comprises:

modulator 114 transforming $X_0$ to $Y_0$ via $Z_0$;

combining means (e.g., adder 122) receiving D and mixing D with $Z_0$ to produce intermediate signal $Z_1$ (e.g., analog signal);

modulator 124 transforming $Z_1$ to $Y_1$ (e.g., digital signal)

a network (e.g., converter 131, subtractor 112, adder 117) for superimposing $Y_1$ on $X_0$ and on $Y_0$ so that D is canceled in $Y_0$. Modulator 114 is a sigma-delta modulator having a substantially analog integrator (e.g., capacitor 162) modulator 124 is a sigma-delta modulator having a substantially digital integrator (e.g., counter 172). The network superimposes $Y_1$ on $X_0$ and on $Y_0$ with opposite signs, for example, by subtractor 112 ("minus") and adder 117 ("plus"). The network also uses attenuation (e.g., in multipliers 127 and 133).

Having described the operation of converter 100 is details in connection with FIGS. 3–5, a method of the present invention for converting an analog input signal $X_0$ to a digital output signal $Y_0$ is conveniently described with the following steps:

modulating $X_0$ by, for example, $\Sigma\Delta$-modulator 114 to provide intermediate signal $Z_0$;

mixing $Z_0$ with dither signal D to provide an intermediate signal $Z_1$;

modulating $Z_1$ by, for example, $\Sigma\Delta$-modulator 124 to provide intermediate signal $Y_1$; and superimposing $Y_1$ to $X_0$ and to $Y_0$ with opposite sign ("+" and "−") and with attenuation (e.g., $K_1$, $K_2$) so that the dither signal D is substantially canceled in output signal $Y_0$. The method of the present invention is also useful applied in processors, such as, for example, in Digital Signal Processors (DSP) or in general purpose processors.

Figure 1:
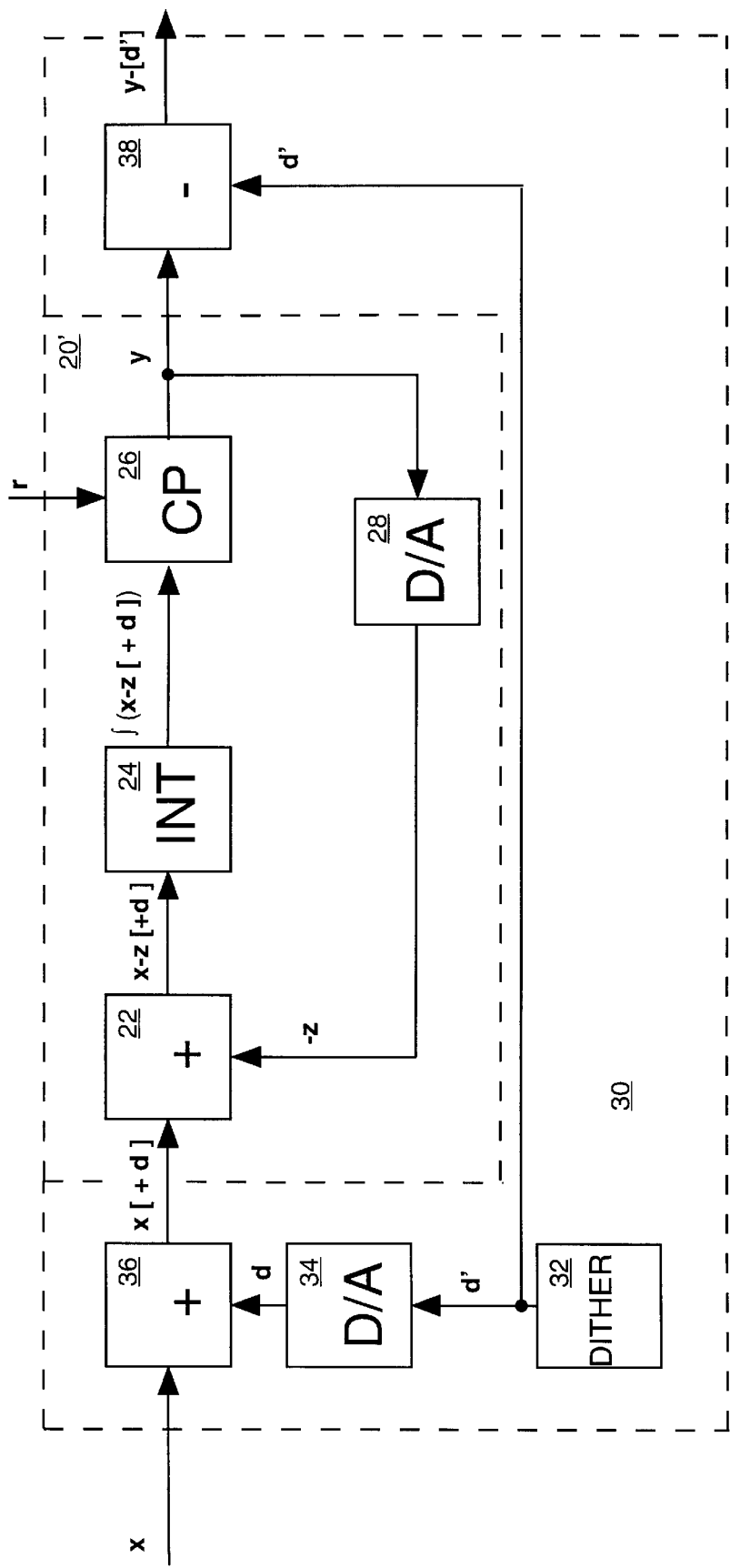
FIG. 1 illustrates a simplified block diagram of a sigma-delta modulator as known in the prior art.
Figure 2:
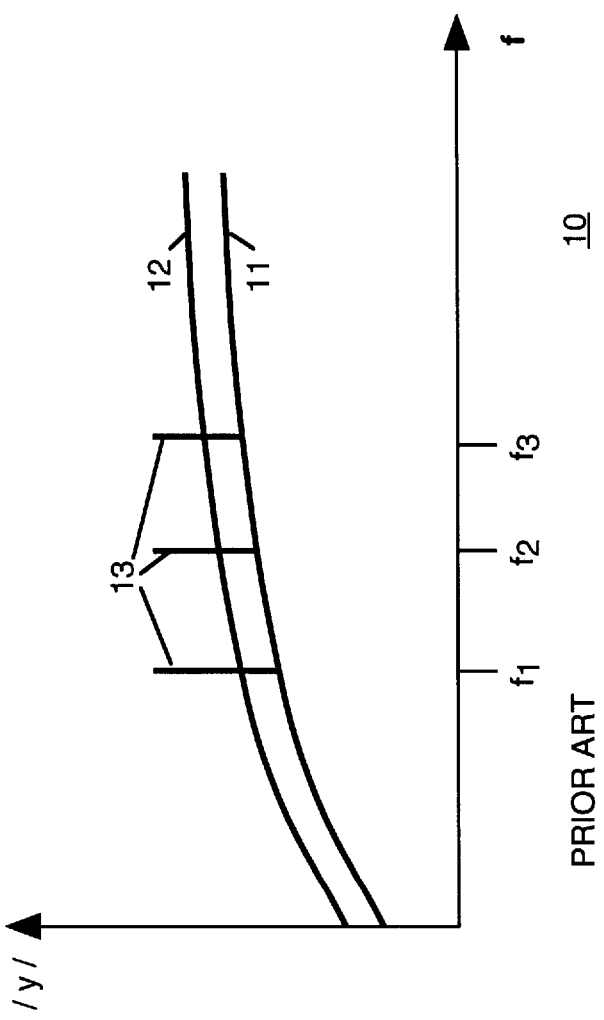
FIG. 2 illustrates a simplified amplitude-frequency diagram of an output signal of the sigma-delta modulator of FIG. 1.

In converter 100, if the input signal $X_0$ has a small amplitude, than signal $Z_0$ at output 114-2 of modulator 114 is highly correlated with dither signal D. Due to the feedback (in path 130) and due to the addition of $Y_1$' and $Z_0$ at adder 117, correlated signal components in $Z_0$ and D are compensated. In comparison to prior art modulator 20 (cf. FIG. 1), the output noise in $Y_0$ of converter 100 is decreased, by e.g., 6–10 dB.

If the input signal $X_0$ is close to a maximum admissible amplitude, modulator 122 partially suppresses dither signal D and output signal $Y_0$ remains substantially without non-linear distortions.

While the invention has been described in terms of particular structures, devices and methods, those of skill in the art will understand based on the description herein that it is not limited merely to such examples and that the full scope of the invention is properly determined by the claims that follow.

We claim:

1. An apparatus receiving an analog input signal $X_0$ and providing a digital output signal $Y_0$, said apparatus comprising:

a first modulator receiving a first intermediate signal $X_0'=X_0-K*X_2$, with $K_2$ being a first multiplication factor and $X_2$ being a second intermediate signal, said first modulator providing a third intermediate signal $Z_0$;

a terminal for receiving a dither signal D;

a second modulator receiving a fourth intermediate signal $Z_1=Z_0+D$ being a sum of said third intermediate signal $Z_0$ and said dither signal D, said second modulator providing a fifth intermediate signal $Y_1$; and a converter circuit converting said fifth intermediate signal $Y_1$; into said second intermediate signal $X_2$, said apparatus providing said digital output signal $Y_0$ as a sum of said fifth intermediate signal $Y_1$ multiplied with a second multiplication factor $K_1$ and said third intermediate signal $Z_0$.

2. The apparatus of claim 1 wherein said first modulator is an analog sigma-delta modulator and wherein said second modulator is a digital sigma-delta modulator.

3. The apparatus of claim 1 wherein said dither signal D is a multilevel dither signal.

4. The apparatus of claim 1 wherein said first intermediate signal $X_0'$ is provided by a subtractor receiving $K_2*X_2$ and $X_0$.

5. The apparatus of claim 1 wherein said output signal $Y_0$ is provided by an adder receiving $Y_1*K_1$ and $Z_0$.

6. The apparatus of claim 1 wherein said first multiplication factor $K_1$ and said second multiplication factor $K_2$ are substantially equal.

7. The apparatus of claim 1 wherein said first multiplication factor $K_1$ and said second multiplication factor $K_2$ are substantially:

$K_1 \approx K_2 \approx K$ and $0.1 \leq K \leq 1$.

8. The apparatus of claim 7 wherein said K is approximately 0.25.

9. The apparatus of claim 1 wherein an a range R(D) of said dither signal D and a range $R(Z_0)$ of said third intermediate signal $Z_0$ are related as: $R(D)=Q*R(Z_0)$, with Q being a range factor between approximately 2 and 8.

10. The apparatus of claim 8 wherein Q is approximately 4.

11. The apparatus of claim 1 wherein said first modulator samples said input signal $X_0$ with a sampling rate $F_X$ which is less than or equal to a change rate $F_D$ of said dither signal D.

12. The apparatus of claim 1 wherein said dither signal D is a signal having $2*N$ levels changes every time $T_D$ by less or equal than n levels.

13. The apparatus of claim 1 further comprising a dither generator providing said dither signal D to said terminal.

14. The apparatus of claim 1 wherein said second modulator has a higher order than said first modulator.

15. An analog-to-digital converter receiving a dither signal D, comprising:

an input terminal for receiving analog input signal $X_0$;

an output terminal for receiving digital output signal $Y_0$;

a plurality of lines for intermediate analog signals $X_0,' X_2, X_2'$;

a plurality of lines for intermediate digital signals $Z_0, Z_1, Y_1, Y_1'$;

a first multiplier for calculating $Y_1'=K_1*Y_1$, with $K_1$ being a first multiplication factor;

a second multiplier for calculating $X_2'=K_2*X_2$, with $K_2$ being a second multiplication factor;

a subtractor for calculating $X_0'=X_0-X_2'$;

a first adder for calculating $Z_1=Z_0+D$;

a second adder for calculating $Y_0=Y_1'+Z_0$;

a first modulator for providing $Z_0=\Sigma\Delta(X_0')$, wherein $\Sigma\Delta$ indicates sigma-delta transformation;

a second modulator for providing $Y_1=\Sigma\Delta(Z_1)$; and a converter for converting digital $Y_1$ to analog $X_2$.

16. An analog-to-digital converter comprising:

a first path having a first modulator transforming an analog input signal $X_0$ from an input terminal to a digital output signal $Y_0$ at an output terminal via a combiner;

a second path having (a) a combining unit for combining a digital dither signal D with a digital intermediate signal $Z_0$ from said first modulator to produce a digital intermediate signal $Z_1$ and having (b) a second modulator for digitally processing said intermediate signal $Z_1$ to produce an intermediate signal $Y_1$ and feeding a first signal depending on $Y_1$ to said combiner with a first sign; and a third path having a transforming unit coupled to said second modulator for feeding a second signal depending on $Y_1$ via said first modulator to said combiner with substantially equal amplitudes and opposite sign to said first signal.

17. The analog-to-digital converter of claim 16 further comprising a first attenuator and a second attenuator, said first attenuator being coupled between said second modulator and said combiner, and said first attenuator being coupled between said transforming unit and said first modulator.

18. The analog-to-digital converter of claim 16 wherein said first and second modulators each have an integrator and a comparator, and wherein (i) in said first modulator, said integrator is implemented by a capacitor and said comparator is implemented by an operational amplifier, (ii) in said second modulator, said integrator is implemented by a counter and said comparator is implemented by a logic unit.

19. A method for converting an analog input signal to a digital output signal, said method comprising the following steps:

modulating said analog input signal to provide a first intermediate signal;

mixing said intermediate signal with a dither signal to provide a second intermediate signal;

modulating said second intermediate signal to provide a third intermediate signal; and superimposing said third intermediate signal to said input signal and to said output signal with opposite sign and with attenuation so that said dither signal is substantially canceled in said digital output signal.

20. The method of claim 19 applied in a general purpose processor.

21. The method of claim 19 applied in a digital signal processor.

22. A converter for converting a first signal in a first form at a first terminal to a second signal in a second form at a second terminal, said converter using a dither signal, said converter comprising:

a first modulator transforming said first signal to said second signal;

combining means for receiving said dither signal and mixing said dither signal with said second signal to produce a first intermediate signal;

a second modulator transforming said first intermediate signal to a second intermediate signal;

a network for superimposing said second intermediate signal on said first signal and said second signal so that said dither signal is canceled in said second signal.

23. The converter of claim 22 wherein said first intermediate signal is an analog signal and said second intermediate signal is a digital signal.

24. The converter of claim 22 wherein said first modulator is a sigma-delta modulator having a substantially analog integrator and wherein said second modulator is a sigma-delta modulator having a substantially digital integrator.

25. The converter of claim 22 wherein said combining means is an adder.

26. The converter of claim 22 wherein said network superimposes said second intermediate signal on said first and second signals with opposite signs.

27. The converter of claim 22 wherein said network superimposes said second intermediate signal on said first and second signals with attenuation.

* * * * *